(12) United States Patent
Sankarakrishnan et al.

(10) Patent No.: US 8,591,699 B2
(45) Date of Patent: Nov. 26, 2013

(54) METHOD AND SYSTEM FOR SUPPLYING A CLEANING GAS INTO A PROCESS CHAMBER

(71) Applicants: Ramprakash Sankarakrishnan, San Jose, CA (US); Dale R. Du Bois, Los Gatos, CA (US); Ganesh Balasubramanian, Sunnyvale, CA (US); Karthik Janakiraman, San Jose, CA (US); Juan Carlos Rocha-Alvarez, San Carlos, CA (US); Thomas Nowak, Cupertino, CA (US); Visweswaren Sivaramakrishnan, Cupertino, CA (US); Hichem M'Saad, Sunnyvale, CA (US)

(72) Inventors: Ramprakash Sankarakrishnan, San Jose, CA (US); Dale R. Du Bois, Los Gatos, CA (US); Ganesh Balasubramanian, Sunnyvale, CA (US); Karthik Janakiraman, San Jose, CA (US); Juan Carlos Rocha-Alvarez, San Carlos, CA (US); Thomas Nowak, Cupertino, CA (US); Visweswaren Sivaramakrishnan, Cupertino, CA (US); Hichem M'Saad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/676,820

(22) Filed: Nov. 14, 2012

(65) Prior Publication Data
US 2013/0213574 A1 Aug. 22, 2013

Related U.S. Application Data

(60) Continuation of application No. 12/571,677, filed on Oct. 1, 2009, now abandoned, which is a division of application No. 12/142,402, filed on Jun. 19, 2008, now Pat. No. 7,699,935.

(51) Int. Cl.
*C23F 1/00* (2006.01)
*H01L 21/306* (2006.01)

(52) U.S. Cl.
USPC .................. 156/345.35; 156/345.29

(58) Field of Classification Search
USPC ........................ 156/345.35, 345.29
See application file for complete search history.

(56) References Cited

U.S. PATENT DOCUMENTS 3,665,958 A 5/1972 Dunkelis
(Continued)

FOREIGN PATENT DOCUMENTS

| JP | 2003-086672 A | 3/2003 |
| JP | 20040329740 A | 2/2004 |
| WO | 02/12587 A2 | 2/2002 |
| WO | 2006121585 A1 | 11/2006 |

OTHER PUBLICATIONS

PCT International Search Report and Written Opinion for International application No. PCT/US2009/045413 dated Nov. 19, 2009.

*Primary Examiner* — Keath Chen
(74) *Attorney, Agent, or Firm* — Paterson & Sheridan, LLP

(57) ABSTRACT

A method and apparatus for cleaning a process chamber are provided. In one embodiment, a process chamber is provided that includes a remote plasma source and a process chamber having at least two processing regions. Each processing region includes a substrate support assembly disposed in the processing region, a gas distribution system configured to provide gas into the processing region above the substrate support assembly, and a gas passage configured to provide gas into the processing region below the substrate support assembly. A first gas conduit is configured to flow a cleaning agent from the remote plasma source through the gas distribution assembly in each processing region while a second gas conduit is configured to divert a portion of the cleaning agent from the first gas conduit to the gas passage of each processing region.

20 Claims, 11 Drawing Sheets

(56) References Cited

U.S. PATENT DOCUMENTS

| | | |
|---|---|---|
| 3,747,892 A | 7/1973 | Gigantino et al. |
| 4,936,289 A | 6/1990 | Peterson |
| 5,098,062 A | 3/1992 | Lungu |
| 5,609,721 A | 3/1997 | Tsukune et al. |
| 5,922,134 A | 7/1999 | Ohbuchi |
| 6,085,772 A | 7/2000 | McGill et al. |
| 6,648,012 B2 | 11/2003 | Linthorst |
| 2001/0025645 A1 | 10/2001 | Shin et al. |
| 2002/0020429 A1 | 2/2002 | Selbrede et al. |
| 2002/0109422 A1 | 8/2002 | Hatton |
| 2003/0079757 A1 | 5/2003 | Shibata et al. |
| 2003/0170402 A1 | 9/2003 | Arai et al. |
| 2003/0172872 A1 | 9/2003 | Thakur et al. |
| 2004/0055636 A1 | 3/2004 | Rocha-Alvarez et al. |
| 2004/0251584 A1 | 12/2004 | Borgmeier |
| 2004/0255854 A1 | 12/2004 | Sakai et al. |
| 2005/0045275 A1 | 3/2005 | Murayama et al. |
| 2005/0252451 A1 | 11/2005 | Beppu et al. |
| 2005/0263072 A1 | 12/2005 | Balasubramanian et al. |
| 2005/0263248 A1 | 12/2005 | Rocha-Alvarez et al. |
| 2006/0090700 A1 | 5/2006 | Satoh et al. |
| 2006/0090773 A1 | 5/2006 | Choi et al. |
| 2006/0201623 A1 | 9/2006 | Yoo |
| 2006/0213436 A1 | 9/2006 | Ohmi et al. |
| 2006/0228473 A1 | 10/2006 | Satoh et al. |
| 2006/0266288 A1 | 11/2006 | Choi |
| 2007/0099438 A1 | 5/2007 | Ye et al. |
| 2007/0132054 A1 | 6/2007 | Arghavani et al. |
| 2007/0207275 A1 | 9/2007 | Nowak et al. |
| 2008/0047610 A1 | 2/2008 | Denike et al. |

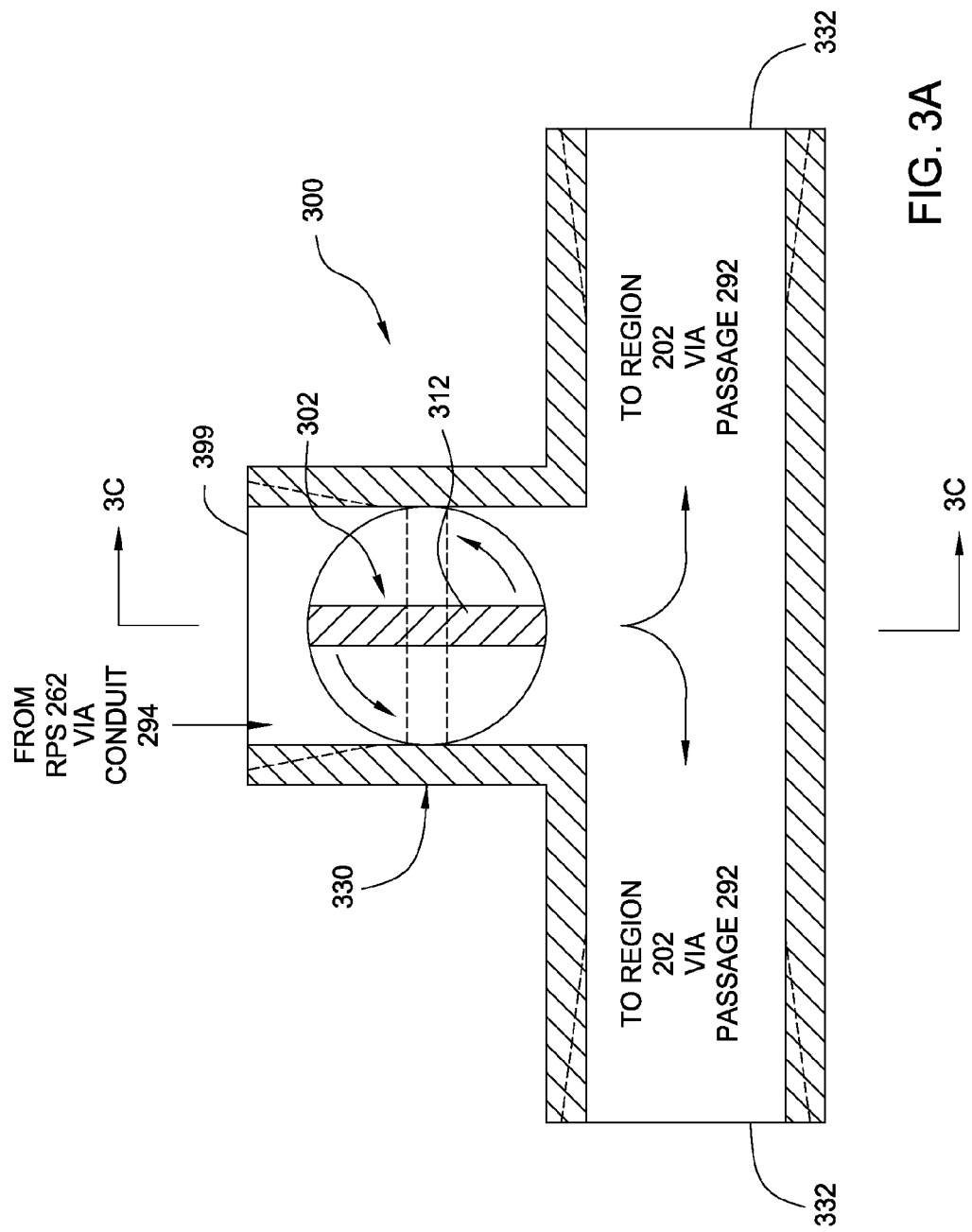

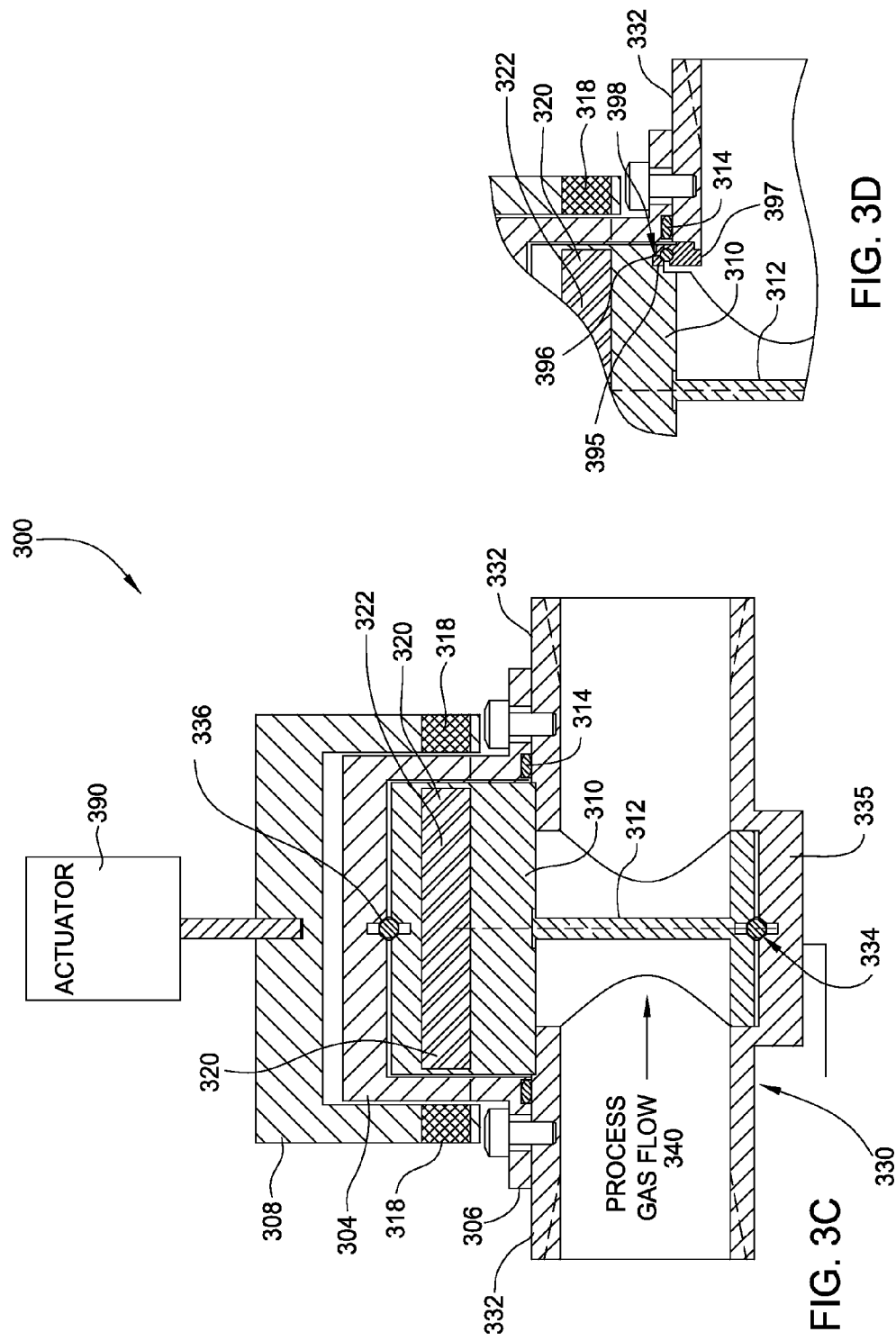

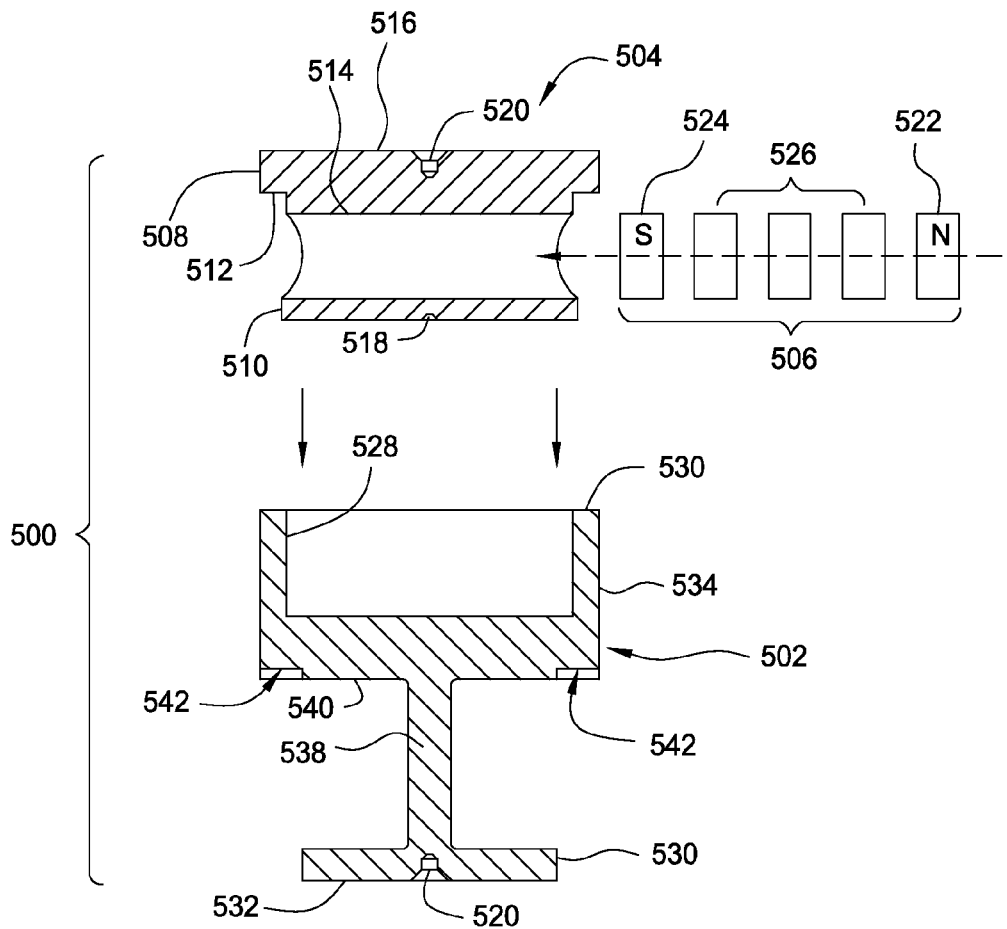
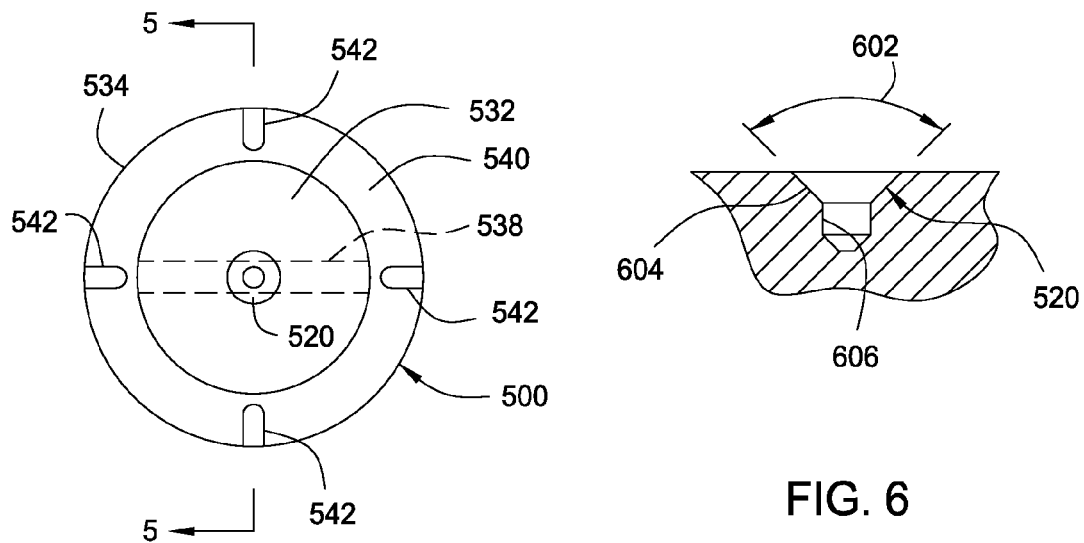
FIG. 5
FIG. 6
FIG. 7

METHOD AND SYSTEM FOR SUPPLYING A CLEANING GAS INTO A PROCESS CHAMBER

CROSS-REFERENCE TO RELATED APPLICATIONS

This application is a continuation of U.S. patent application Ser. No. 12/571,677, filed Oct. 1, 2009, now abandoned, which is a divisional application of U.S. patent application Ser. No. 12/142,402, filed Jun. 19, 2008 now U.S. Pat. No. 7,699,935. Each of the aforementioned applications is herein incorporated by reference.

BACKGROUND OF THE INVENTION

1. Field of the Invention

Embodiments of the invention generally relate to apparatuses and methods for cleaning process chambers of substrate processing apparatuses. More particularly, embodiments of the present invention relate to apparatus and methods for cleaning a process chamber used for deposition.

2. Description of the Related Art

After a number of deposition steps have been performed in a process chamber, the process chamber may need cleaning to remove undesirable deposition residues that may have formed on the chamber wall. One conventional approach for cleaning current chemical vapor deposition (CVD) or plasma enhanced chemical vapor deposition (PECVD) process chambers is to use cleaning plasma supplied from a remote plasma source (RPS) separate from the process chamber. The RPS provides the cleaning plasma, usually formed from a fluorine-based cleaning gas, which is flowed into the deposition chamber via gas circulation hardware comprising a gas box, gas manifold, and a gas distribution system installed in the process chamber.

To obtain a higher etching rate during cleaning, the cleaning plasma is usually supplied in an active form comprised of atomic fluorine radicals. However, complex transport paths from the RPS to the deposition chamber usually results in a premature recombination of the atomic fluorine radicals into molecular gases that have a lower etching rate. Consequently, cleaning efficiency may be low even if precursor dissociation efficiency of cleaning gases is high. Further, for chambers having large volume and intricate geometry, such as a 300 mm process chamber, the chamber pumping port is usually close to a shower head utilized to deliver cleaning gases to the chamber. Therefore, poor circulation of gases under a substrate support assembly positioned between the showerhead and pumping port results in decreased cleaning efficiency under the substrate support assembly.

Therefore, there is a need for an improved apparatus and method for cleaning a deposition chamber.

SUMMARY OF THE INVENTION

A method and apparatus for cleaning a process chamber are provided. In one embodiment, a process chamber is provided that includes a remote plasma source and a process chamber having at least two processing regions. Each processing region includes a substrate support assembly disposed in the processing region, a gas distribution system configured to provide gas into the processing region above the substrate support assembly, and a gas passage configured to provide gas into the processing region below the substrate support assembly. A first gas conduit is configured to flow a cleaning agent from the remote plasma source through the gas distribution assembly in each processing region while a second gas conduit is configured to divert a portion of the cleaning agent from the first gas conduit to the gas passage of each processing region.

In another embodiment, a substrate processing system is provided that includes a loadlock chamber, a transfer chamber coupled to the loadlock chamber, a remote plasma source, and a process chamber coupled to the transfer chamber. The process chamber includes a chamber body having at least a first processing region, a first substrate support assembly disposed in the first processing region, a first gas distribution assembly coupled to the remote plasma source and configured to provide gases from the remote plasma source into first processing region from above the substrate support assembly, and a gas passage coupled to the remote plasma source and configured to provide gases from the remote plasma source into the first processing region from below the substrate support assembly.

In another embodiment, a method for supplying a processing gas into a process chamber is disclosed. The method comprises providing a plasma source, flowing a first volume cleaning agent from the plasma source through the top of the process chamber into an interior volume of the process chamber, and flowing a second volume of cleaning agent into the interior volume from below a substrate support assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a horizontal cross-sectional view illustrating one embodiment of a valve used in the process chamber of FIG. 2.

FIG. 3C is a cross-sectional view illustrating the valve of FIG. 3A.

FIG. 3D is a partial cross sectional view showing an alternative embodiment of a valve.

FIG. 5 is an exploded cross-sectional view of another embodiment of a flapper.

FIGS. 6-7 are partial sectional view and a top view of the flapper of FIG. 5.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to a substrate processing system that is operable to perform a plasma process (such as etch, CVD, PECVD and the like) on one or more substrates, and undergo plasma cleaning to remove residues formed during the deposition process. One illustrated example of the substrate processing system comprises, without limitation, a factory interface, a loadlock chamber, a transfer chamber, and at least one process chamber having two or more processing regions that are isolatable from each other and share a common gas supply and common exhaust pump. To remove deposition residues from the interior of the process chamber, a remote plasma source is operable to generate cleaning plasma that is supplied into the interior of the process chamber from the top and bottom of the process chamber. The interior of the process chamber can thereby be cleaned in a more efficient manner.

Figure 1:
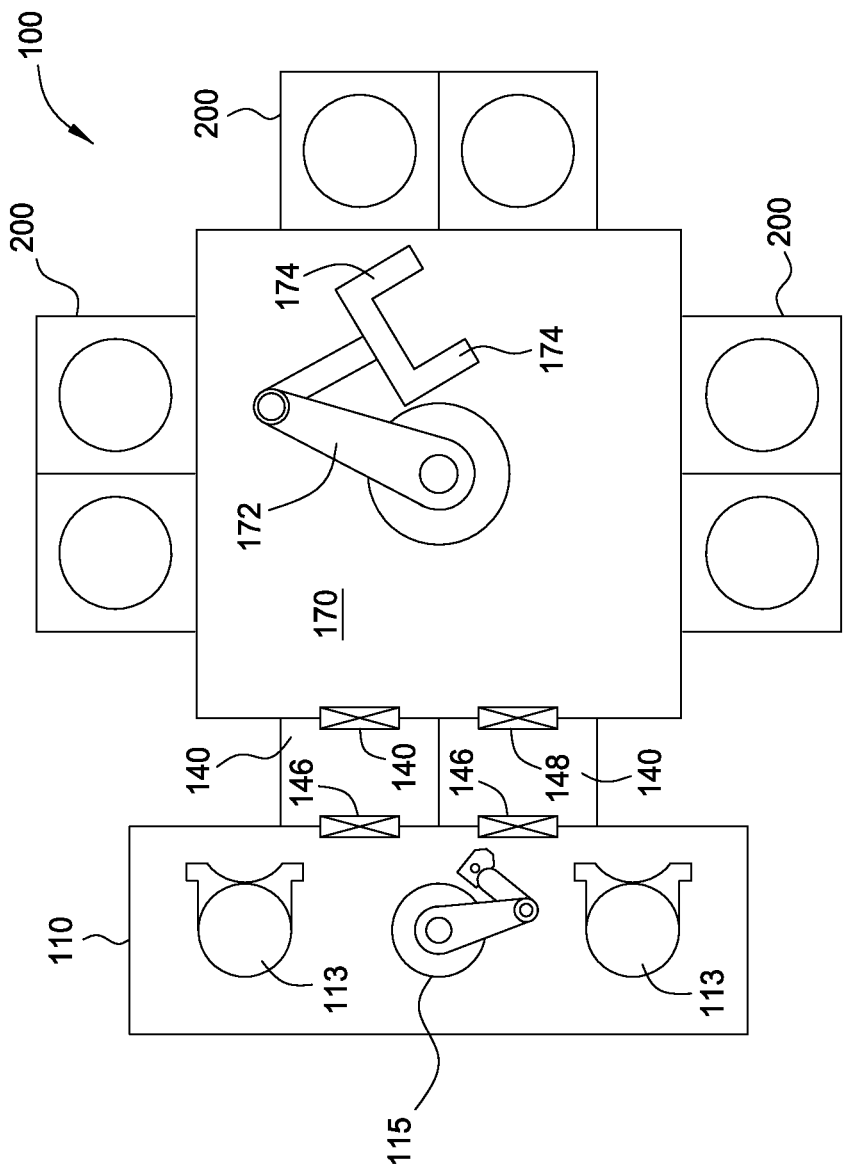
FIG. 1 is a schematic plan view showing one embodiment of a processing system having a cleaning system.

FIG. 1 is a schematic view showing an embodiment of a substrate processing system 100. The substrate processing system 100 comprises a factory interface 110 where substrates are loaded into and unloaded from at least one loadlock chamber 140, a substrate transfer chamber 170 housing a robot 172 for handling substrates, and at least one process chamber 200 connected to the transfer chamber 170. The processing chamber 100 is adapted to accommodate various plasma processes and support chamber hardware such as etch, CVD or PECVD processes.

As shown in FIG. 1, the factory interface 110 may include substrate cassettes 113 and a substrate-handling robot 115. Each of the cassettes 113 contains substrates ready for processing. The substrate-handling robot 115 may comprise a substrate mapping system to index the substrates in each cassette 113 in preparation for loading the substrates into the loadlock chambers 140.

The loadlock chambers 140 provide a vacuum interface between the factory interface 110 and the transfer chamber 170. Each loadlock chamber 140 may comprise an upper substrate support (not shown) and a lower substrate support (not shown) stacked within the loadlock chamber 140. The upper substrate support and the lower substrate support are configured to support incoming and outgoing substrates thereon. Substrates may be transferred between the factory interface 110 and the loadlock chamber 140 via a slit valve 146, and between the loadlock chamber 140 and the transfer chamber 170 via a slit valve 148. The upper substrate support and lower substrate support may comprise features for temperature control, such as built-in heater or cooler to heat or cool substrates during transferring.

The transfer chamber 170 includes a substrate-handling robot 172 operable to transfer substrates between the loadlock chamber 140 and the process chamber 200. More specifically, the substrate-handling robot 172 may have dual substrate-handling blades 174 suitable to transfer two substrates at the same time from one chamber to another. The blades 174 may also be configured to move independent each other. Substrates may be transferred between the transfer chamber 170 and the process chamber 200 via slit valves 176. The movement of the substrate-handling robot 172 may be controlled by a motor drive system (not shown), which may include a servo or stepper motor.

Figure 2:
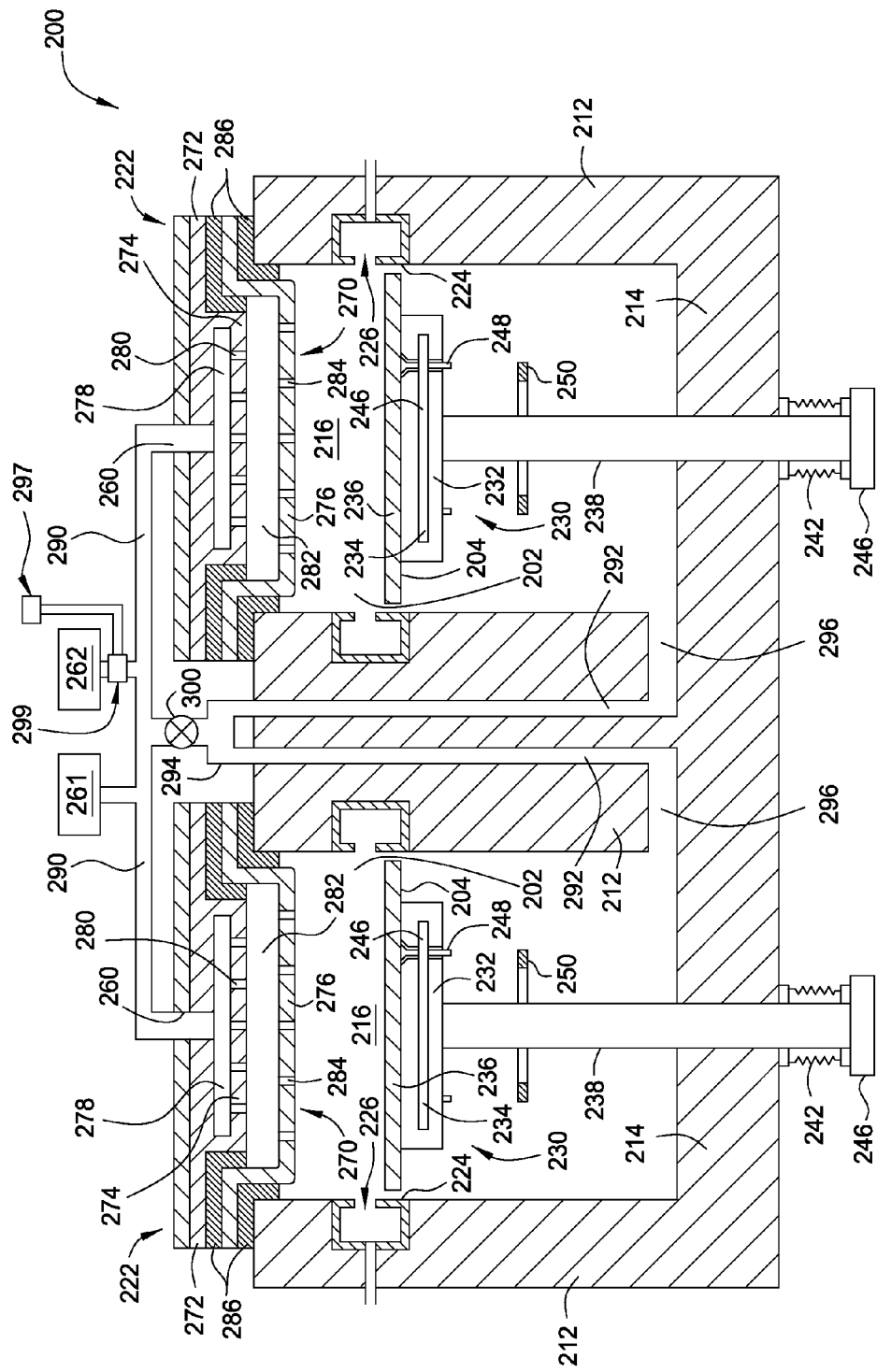
FIG. 2 is a schematic cross-sectional view of one embodiment of a twin process chamber.

FIG. 2 is a schematic cross-sectional view illustrating one embodiment of the process chamber 200. The process chamber 200 comprises two processing regions 202 in which substrates 204 can undergo plasma processing in a concurrent manner. Each processing region 202 has sidewalls 212 and a bottom 214 that partially define a process volume 216. The process volume 216 may be accessed through an access port (not shown) formed in the walls 212 as selectively sealed by valves 176 that facilitate movement of the substrate 204 into and out of each processing region 202. The walls 212 and bottom 214 of each processing region 202 may be fabricated from a unitary block of aluminum or other material compatible with processing. The walls 212 of each processing region 202 support a lid assembly 222, and also include the assembly of a liner 224 having an exhaust port 226 through which the processing region 202 may be evacuated uniformly by a vacuum pump (not shown).

A substrate support assembly 230 is centrally disposed within each processing region 202. In one embodiment, the support assembly 230 may be temperature controlled. The support assembly 230 comprises a support base 232 made of aluminum that may encapsulate at least one embedded heater 234 operable to controllably heat the support assembly 230 and the substrate 204 positioned thereon to a predetermined temperature. In one embodiment, the support assembly 230 may operate to maintain the substrate 204 at a temperature between about 150 degrees Celsius to about 1000 degrees Celsius, depending on the processing parameters for the material being processed.

Each support base 232 has an upper side 236 for supporting the substrate 204, whereas the lower side of the support base 232 is coupled to a stem 238. The stem 238 couples the support assembly 230 to a lift system 240 that moves the support assembly 230 vertically between an elevated processing position and a lowered position that facilitates substrate transfer to and from the processing region 202. The stem 238 additionally provides a conduit for electrical and thermocouple leads between the support assembly 230 and other components of the chamber 200. A bellows 242 may be coupled between the stem 238 and the bottom 214 of each processing region 202. The bellows 242 provides a vacuum seal between the process volume 216 and the atmosphere outside each processing region 202 while facilitating vertical movement of the support assembly 230.

To facilitate the transfer of the substrate 204, each support base 232 also has a plurality of openings 246 through which lift pins 248 are movably mounted. The lift pins 248 are operable to move between a first position and a second position. The first position, shown in FIG. 2, allows the substrate 204 to rest on the upper side 236 of the support base 232. The second position (not shown) lifts the substrate 204 above the support base 232 so that the substrate 204 can be transferred to the substrate-handling robot 172 coming through an access port (not shown). Upward/downward movements of the lift pins 248 may be driven by a movable plate 250.

The lid assembly 222 provides an upper boundary to the process volume 216 in each processing region 202. The lid assembly 222 may be removed or opened to service the processing regions 202. In one embodiment, the lid assembly 222 may be fabricated from aluminum.

The lid assembly 222 may include an entry port 260 through which a processing gas may be introduced into the processing region 202. The processing gas may comprise deposition (or etch) gases provided from a gas source 261, or cleaning plasma provided from a remote plasma source (RSP) 262. A gas distribution assembly 270 may be coupled to an interior side of the lid assembly 222. The gas distribution assembly 270 includes an annular base plate 272 having a blocker plate 274 disposed intermediate to a faceplate (or shower head) 276. The blocker plate 274 provides an even gas distribution to a backside of the faceplate 276. A processing gas supplied via the entry port 260 enters a first hollow volume 278 partially limited between the annular base plate 272 and the blocker plate 274, and then flows through a plurality of passages 280 formed in the blocker plate 274 into a second volume 282 between the blocker plate 274 and the faceplate 276. The processing gas then enters the process volume 216 from the second volume 282 through a plurality of passages 284 formed in the faceplate 276. The faceplate 276 is isolated from the chamber walls 212 and blocker plate 274 (or base plate 272) via an insulator material 286. The annular base plate 272, blocker plate 274 and faceplate 276 may be fabricated from stainless steel, aluminum, anodized aluminum, nickel or other compatible metal alloys cleanable with a plasma, such as a chlorine based cleaning gas, a fluorine based cleaning gas, a combination thereof or other selected cleaning chemistry.

To deliver the processing gas to each processing region 202, a gas circulation system is installed between each processing region 202 and the gas source 261 and RPS 262. The gas circulation system comprises first gas conduits 290 that respectively link the entry port 260 at the top of each processing region 202 to the gas source 261 and RPS 262, and at least one second gas conduit 294 connected with the first gas conduit 290 via a valve 300. The second gas conduit 294 is coupled to one or more passages 292 that extends downward through the chamber walls and intersects one or more cross-channels 296 that respectively open into a bottom portion of each processing region 202. In the embodiment depicted in FIG. 2, separate passages 292, 296 are utilized to couple each region 202 separately to the valve 300. It is also contemplated that each region 202 may have gas delivery thereto controlled by a separate dedicated valve 300 so that the flow of cleaning gas may be delivered selectively and independently to each region 202, including delivering cleaning gas to one of the regions 202 and not the other. When a cleaning plasma is provided from the RPS 262, the valve 300 can be open so that a portion of the cleaning plasma that is delivered through the top of each processing region 202 can also be diverted to the bottom portion of each processing region 202. The stagnation of cleaning plasma below the substrate support assembly 230 can thereby be substantially prevented and the cleaning efficiency to the region below the substrate support assembly 230 be improved.

Figure 3B:
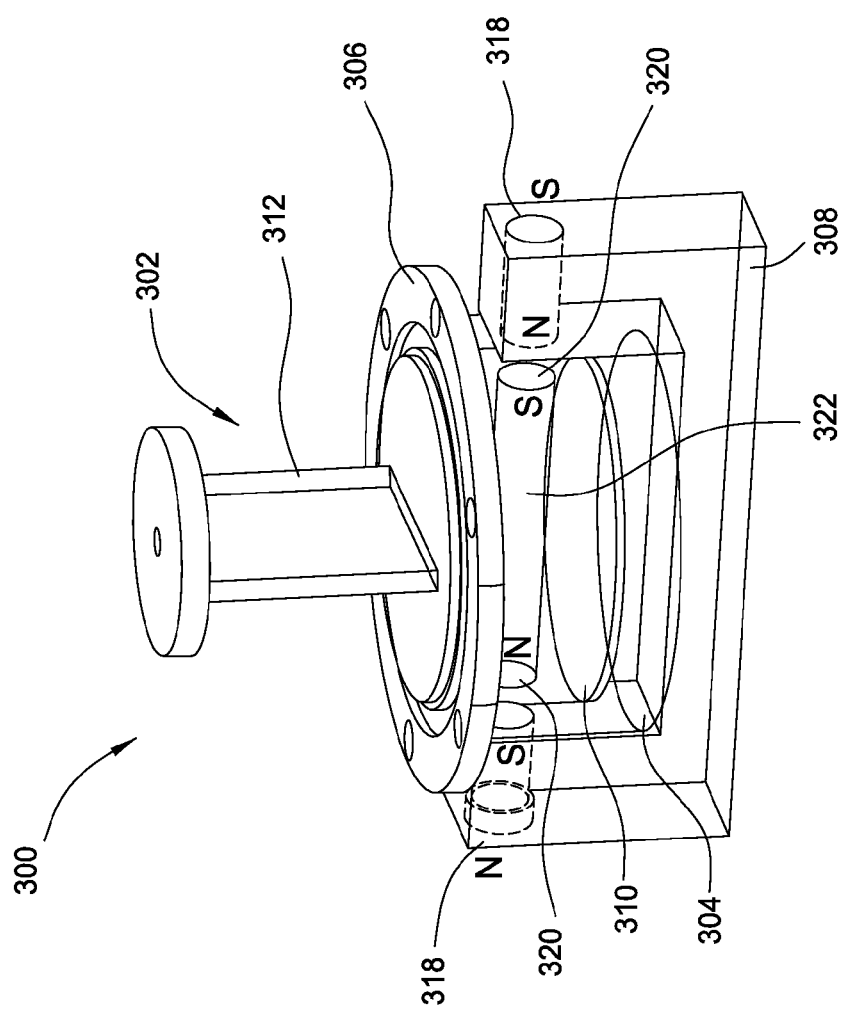
FIG. 3B is a schematic partial isometric cut-away view illustrating the valve of FIG. 3A.

FIGS. 3A-3B are horizontal sectional and schematic partial isometric views illustrating one embodiment of the valve 300. As shown, the valve 300 comprises a valve body 330, a flapper 302, a seal cup 304 and a coupling mechanism 308. The valve body 330 may be fabricated from a high temperature material suitable for use with the cleaning and process chemistries. Examples of suitable materials include aluminum, aluminum oxide, aluminum nitride, sapphire and ceramic, among others. Other examples of suitable materials include materials that are resistant to corrosion from fluorine and oxygen radicals. In one embodiment, the valve body 330 is fabricated from aluminum. The valve body 330 houses the flapper 302 which may be selectively rotated to substantially prevent flow from passing between an inlet 399 of the valve body 330 and a pair of outlet ports 332. The inlet 399 is configured to be coupled to the RPS source 262, while the outlet ports 332 are configured to be coupled to the region 202 through the second gas conduit 294 and passages 292. The inlet 399 and outlet ports 332 may be configured to accept a fitting suitable for making leak-free connection to the conduits 290, 294.

The actuator portion of the flapper 302 is surrounded by the cup seal 304, which is used to securely fix the seal cup 304 to the valve body 330. The flapper 302 is divided into an outer body 310 having a generally cylindrical shape, and a flow-obstructing plate 312 attached to an opposite side of the outer body 310. In one embodiment, the flapper 302 including the outer body 310 and obstructing plate 312 may be a single undivided body made of aluminum or other material as mentioned above. The flapper 302 and body 330 are fabricated with close tolerances so that minimal leakage occurs there between. Thus, the flapper 302 and body 330 are designed to eliminate the need for a separate dynamic seal which may wear and/or be attached by the cleaning gases and/or other species. When in use, the seal cup 304, which substantially encapsulates the outer body 310, is adapted to allow relative rotation of the flapper 302, and substantially seal the side of the flow-obstructing plate 312 corresponding to the interior of the gas circulation system from the outside environment.

The rotation of the flapper 302 is driven via the coupling mechanism 308. In one embodiment, the coupling mechanism 308 has a generally U-shape with two magnetized end portions 318. The magnetized end portions 318 have embedded magnets that are completely enclosed inside the flapper 302 so that direct contact of the embedded magnet to corrosive gases is prevented. The coupling mechanism 308 is placed over the seal cup 304, with the two magnetized end portions 318 respectively facing two opposite poles 320 of a magnet 322 embedded in the outer body 310. The magnet 322 may be a permanent magnet and/or an electromagnet. As a gap is present between the seal cup 304 and the coupling mechanism 308, the seal cup 304 is protected from high temperature contact with the coupling mechanism 308. When the coupling mechanism 308 rotates, the magnetic attraction between the magnetized end portions 318 and the opposite poles 320 of the magnet 322 causes the flapper 302 to rotate. In this manner, the orientation of the flow-obstructing plate 312 can be changed by rotation to either allow gas flow passage (open state, as shown in FIG. 3A) or block gas flow passage (closed state, as shown in phantom in FIG. 3A).

FIG. 3C is a cross-sectional view showing one embodiment of the valve 300 coupled to the second conduit 294 taken along section line C-C of FIG. 3A. The cup seal 304 includes a collar 306 which may be fastened to the valve body 330 to retain the flapper 302. A static seal 314 may be provided between the valve body 330 and collar 306 to prevent leakage. The static seal 314 may be fabricated from a material suitable for use with the process and cleaning chemistries, which in embodiment utilizing fluorine-based cleaning gases, may be VITON. Since the valve 300 has no moving, shaft or dynamic seals, the service life of the valve is greatly extended over conventional designs, and can be operated at temperatures above 250 degrees Celsius with substantially no corrosion of the valve components.

The rotation of the flapper 302 may be facilitated via a ball bearing 334 that interfaces between an end of the flow-obstructing plate 312 and a wall 335 of the valve body 330, and ball bearing 336 that interfaces between the outer body 310 to the seal cup 304. Driven via the coupling mechanism 308, the orientation of the flow-obstructing plate 312 can thereby be oriented to either block or permit the passage of an incident gas flow 340, such as the cleaning gas being directed into the second gas conduit 294.

Alternatively, or in addition to the ball bearings 334, 336, a bearing 398 may be disposed between the flapper 302 and the valve body 330 as shown in FIG. 3D. The bearing 398 may be fabricated materials that are resistant to corrosion from fluorine and oxygen radicals, which in one embodiment is a ceramic material. The bearing 398 includes an upper race 395 that rotates on a lower race 397 via a plurality of roller 396. The upper race 395 is in contact with the flapper 302. In one embodiment, the upper race 395 is press-fit to the flapper 302. The lower race 397 is in contact with the valve body 330. In one embodiment, the lower race 397 is press-fit to the valve body 330. The rollers 396 may have a cylinder, ball, tapered, conical or other suitable shape.

Figure 3E:
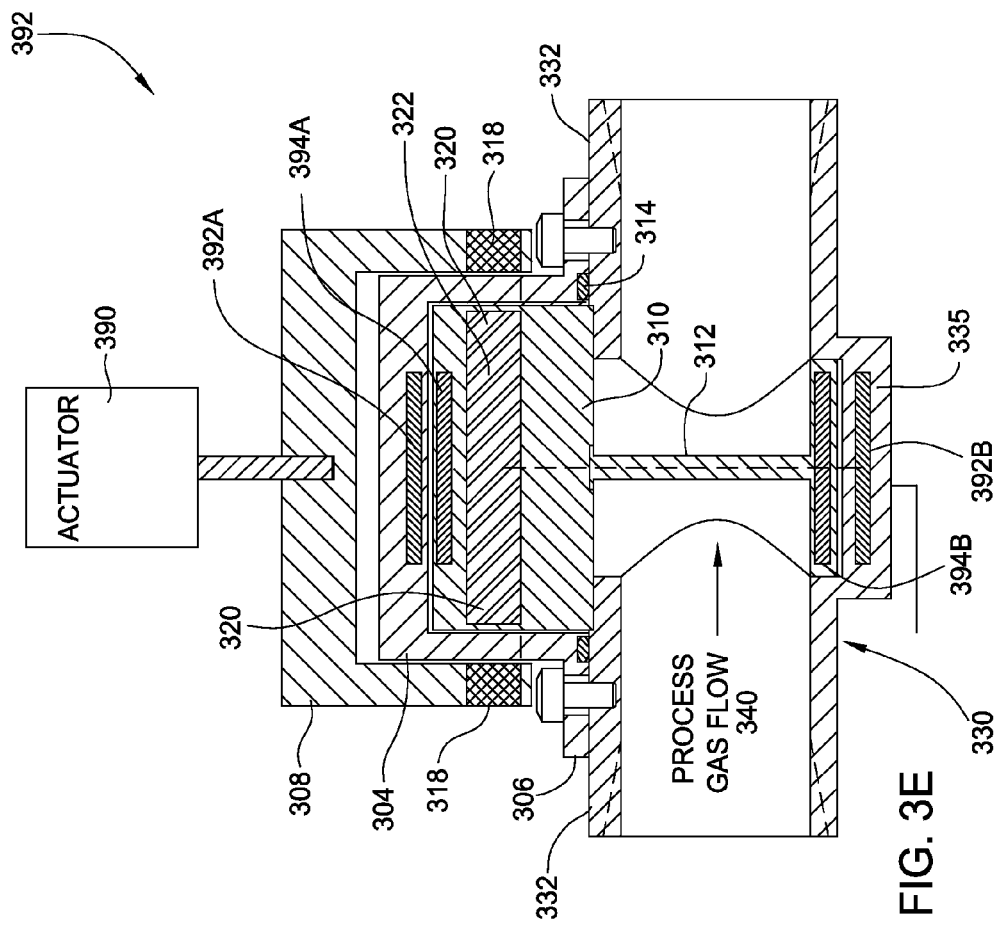
FIG. 3E is a cross sectional view showing one embodiment of a valve.

Alternatively, one or more magnetic bearings 390 may be utilized to provide a bearing between the flapper 302 and the valve body 330 as shown in FIG. 3E. The magnetic bearing 390 includes a pair of repelling magnets. In the embodiment depicted in FIG. 3E, the magnetic bearing 390 includes two pair of repelling magnets, a first pair 392A, 394A and a second pair 392B, 394B disposed at opposite ends of the flapper 302. The magnets 394A, 394B are encapsulated with in the flapper 302 so that they are protected from the fluorine and oxygen radicals present in the cleaning gases. The magnets 392A, 392B may be permanent magnets or electromagnets. The magnets pair 392A, 394A and 392B, 394B function to levitate the flapper 302 within the valve body 330 so that the flapper 302 may be freely rotated by the magnetic interaction with the coupling mechanism 308.

The coupling mechanism 308 rotated by an actuator 390 to open and close the valve 300. The actuator 390 may be a solenoid, air motor, electric motor, pneumatic cylinder or other actuator suitable for controlling the rotary motion of the coupling mechanism 308. The actuator 390 may be mounted to the valve 300, process chamber 200 or other suitable structure.

Figure 4:
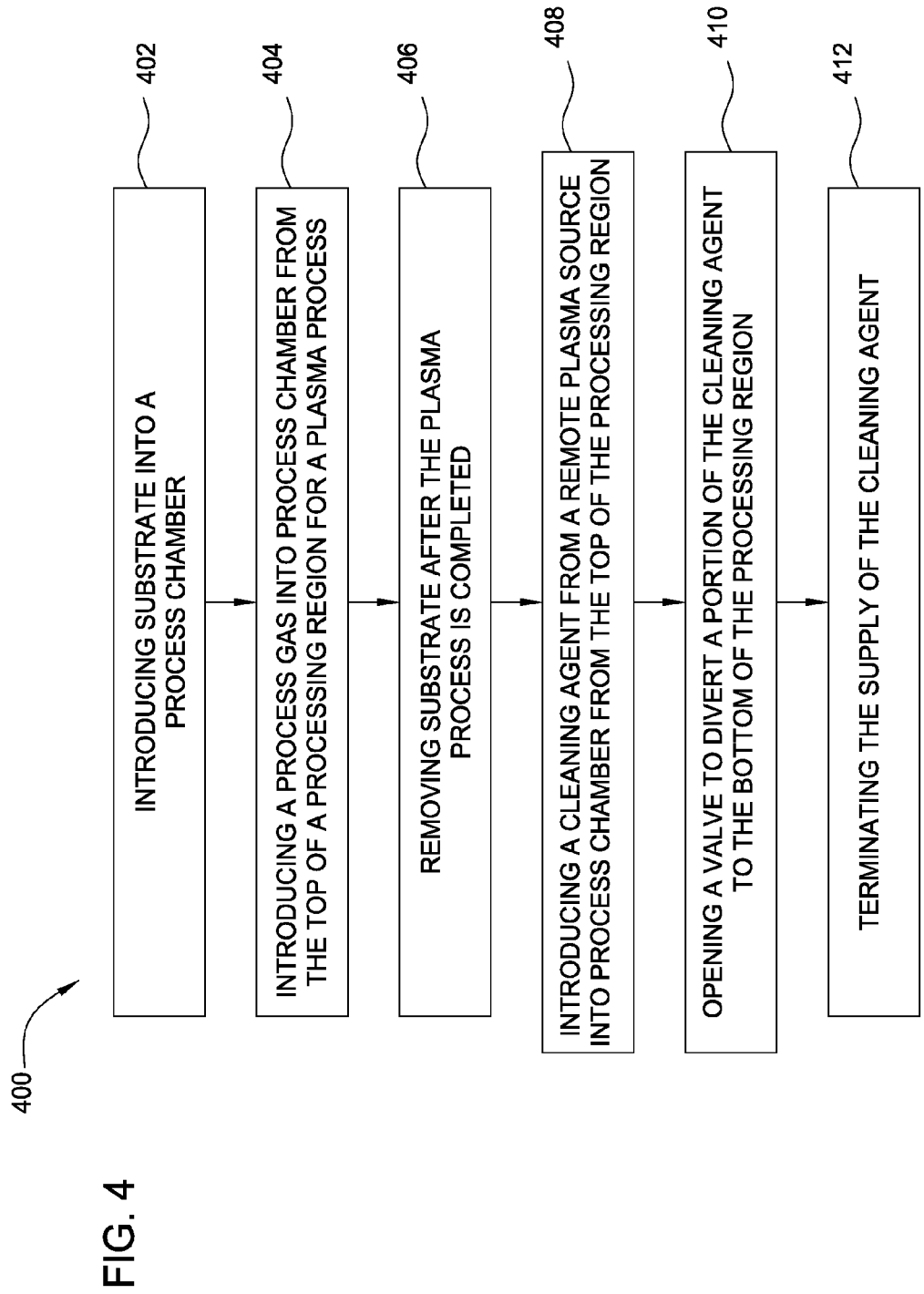
FIG. 4 is a flowchart of method steps for one embodiment of deposition sequence that may be performed in the process chamber of FIG. 2.

FIG. 4 is a flowchart illustrating method steps of one embodiment of a sequence for operating the process chamber 200. In initial step 402, a substrate is introduced in a processing region 202 of the process chamber 200 to undergo a plasma process, such as an etch or deposition process. In step 404, while the valve 300 is closed, a process gas is delivered from the gas source 261 into the process volume 216 through the first conduit 290 and the gas distribution plate assembly 270 at the top of each processing region 202. In step 406, after the plasma process is completed, the substrate is removed out of the processing region 202. In step 408, while the valve 300 is in a closed state, a cleaning agent from the RPS 262, such as a chlorine based cleaning gas, a fluorine based cleaning gas, or a combination thereof, is delivered through the first conduit 290 and the gas distribution plate assembly 270 at the top of each processing region 202. In one embodiment, the cleaning gas may comprise at least one of $NF_3$, $F_2$, $SF_6$, $Cl_2$, $CF_4$, $C_2F_6$, $CCl_4$ or $C_2Cl_6$. While the cleaning gas is introduced through the top of each processing region 202, the valve 300 in step 410 is opened for a period of time to divert a portion of the supplied cleaning plasma through the passages 292 to the bottom 214 of each processing region 202 below the substrate support assembly 230. This additional flow of cleaning plasma reduces the recombination of fluorine radicals, and eliminates the flow stagnation under the support assembly 230. Moreover, the introduction of the diverted cleaning gas through the channels 196 creates a well-mixed turbulent flow below the substrate support assembly 230 prior to being pumped out of the chamber 200. As a result, the cleaning rate in each processing region 202 may be improved. It is contemplated that the opening of the valve 300 in step 410 may occur prior to or simultaneously with the introduction of the cleaning gas at step 408. In step 412, once the cleaning operation is completed, the supply of cleaning gas is terminated. It is also contemplated that the valve 300 may be another type of valve suitable for controlling the relative flows through the conduits 290, 294 from the RPS source 262, including switching between the flows through the conduits 290, 294 between flow and no-flow conditions, or providing a range of selected flow ratios through the conduits 290, 294.

As has been described above, the substrate processing system is thus able to controllably flow processing gases through both the top and bottom of a process chamber. During cleaning, the controlled supply of a cleaning plasma concurrently through the top and bottom of the process chamber into the process volume (i.e., from both the top and bottom sides of the substrate support) can decrease the recombination of chemical radicals inside the process volume. The horizontal introduction of the cleaning gas below the support assembly produces a turbulent flow which enhances chamber cleaning. Further, lower total mass flow rate causes a higher weight percentage of cleaning agents to flow into the bottom of the processing chamber. For example, 42.67 mass percentage of cleaning agent may be directed to the bottom of the processing chamber through the conduit 294 and passages 292 under a total plasma flow rate at 5000 sccm while only 28.8 mass percentage of cleaning agent flows to the bottom of the processing chamber under a total plasma flow rate at 15,000 sccm. As a result, lower total plasma flow rate can divert more percentage of the cleaning agent to the bottom of the process chamber, and thus the process chamber can be cleaned more efficiently.

FIG. 5 is an exploded view of another embodiment of a flapper 500. FIG. 6 is a top view of the flapper 500. Referring to both FIGS. 5-6, the flapper 500 includes a body 502, a cap 504 and one or more magnets 506. flapper 302 including the outer body 310 and obstructing plate 312 may be a single undivided body made of aluminum or other material as mentioned above. The body 502 and cap 504 may be fabricated from the materials described above.

The body 502 includes outer body 534 and an obstructing plate 538. The outer body 534 has recess 528 formed in a first end 530 that is sized to receive at least a portion of the cap 504. In one embodiment, the cap 504 is pressed fit into the recess 528 so the cap 504 cannot rotate within the recess 528. Alternatively, the cap 504 may be pinned, adhered, bonded, welded or otherwise fastened to the body 502 in a manner that prevents rotation.

The obstructing plate 538 extends from a second end 540 of the body 502 to a disk 536. The disk 536 is sized to interface with a recess formed in the valve body to facilitate rotation of the flapper 500. The disk 536 generally has a diameter less than a diameter of the outer body 534. A bottom surface 532 of the disk 536 includes pocket 520 for retaining a ball bearing (not shown) that facilitates rotation of the flapper 500.

The second end 540 of the body 502 also includes a plurality of depressions 542 formed therein. In one embodiment, the depressions 542 are radially orientated and equally spaced about a polar array. The depressions 542 are configured to mate with projections (not shown) extending from upper race 395 so that the race 395 is locked in rotation with the flapper 500.

FIG. 7 is a partial sectional view of the disk 536 through the pocket 520. The pocket 520 includes a blind hole 606 that is formed concentric to the centerline of the body 502. A countersink 604 is formed concentric with the hole 606. The countersink 604 is formed at an angle that facilitates retention of the ball bearing within the pocket 520.

Returning to FIGS. 5-6, the cap 504 includes a cylindrical body 510 having an upper end 516 and a lower end 518. The cylindrical body 510 has a diameter that fits within the recess 528 of the body 502. A lip 508 formed at the upper end 516 of the body 510 so that the end 530 of the body 502 seats on a ledge 512 defined by the lip 508, thereby setting the penetration of the body 510 into the body 502 at a predetermined depth. A pocket 520 may also be formed in the cap 504 to facilitate retention of a ball bearing (not shown) on the center axis of the flapper 500.

A cross-hole 514 is formed through the body 510 to receive the one or more magnets 506. The cross-hole 514 is formed perpendicular to a centerline of the flapper 500. The one or more magnets 506 are captured in the cross-hole 514 when the cap 504 is inserted into the recess 528 of the body 502.

In one embodiment, the one or more magnets 506 include a plurality of magnets stacked in a linear arrangement. In the embodiment of FIG. 5, the one or more magnets 506 include a North pole 524, a South pole 522 and one more magnets 526 stacked therebetween.

Figure 8A:
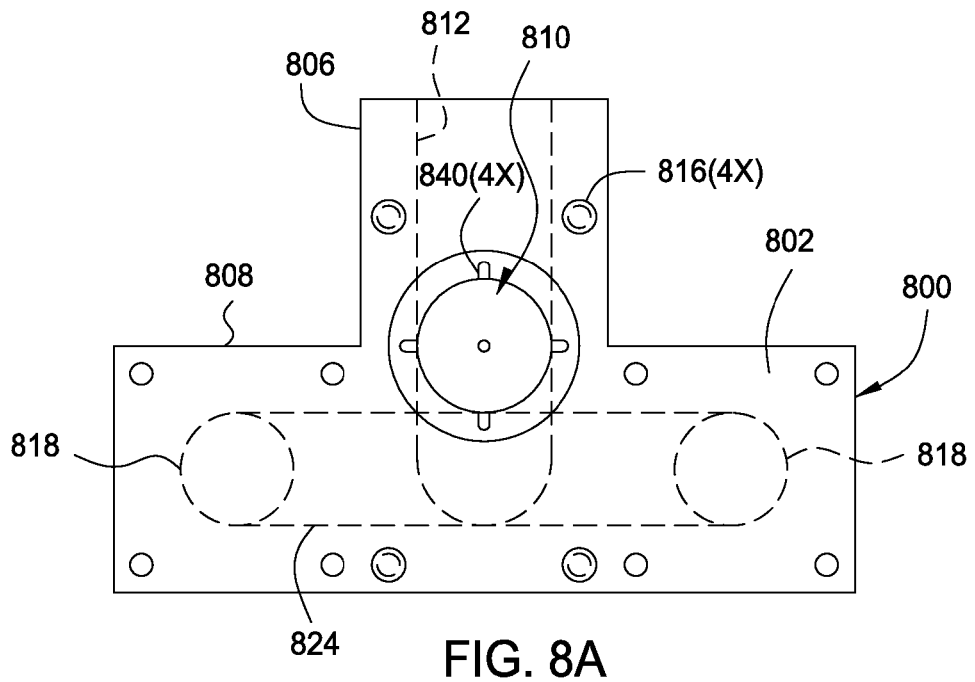
FIGS. 8A-8B are top and bottom views of another embodiment of a valve body.
Figure 8B:
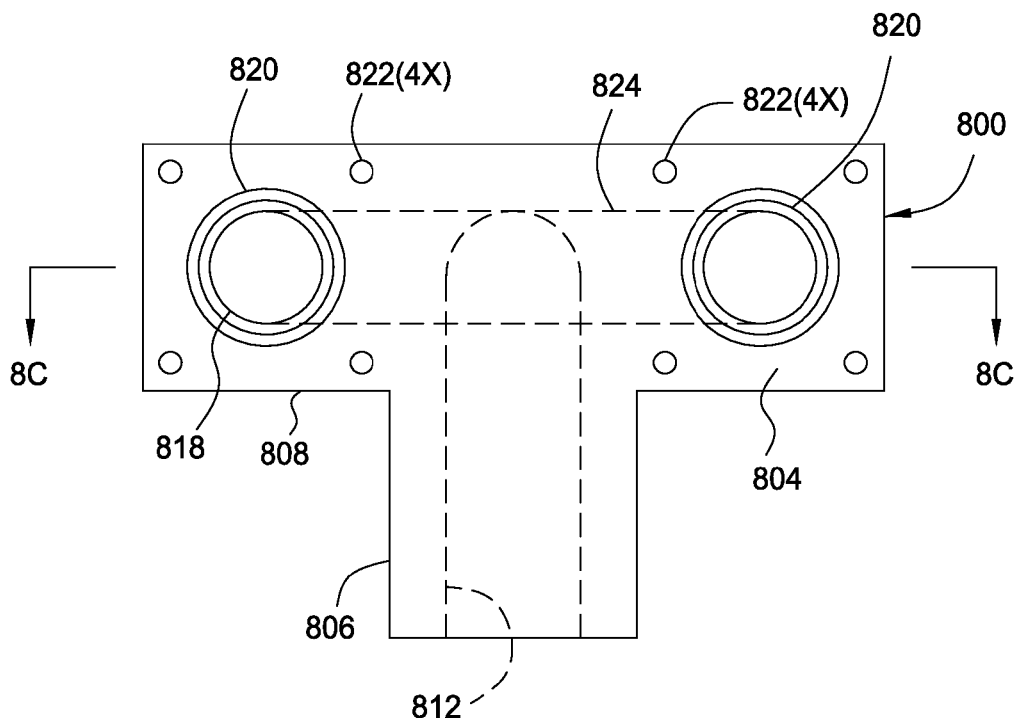

FIGS. 8A-8B are top and bottom views of another embodiment of a valve body 800. The valve body 800 is generally a unitary aluminum or ceramic member, although the valve body 800 may be fabricated from other suitable materials. The valve body 800 includes a top surface 802 and a bottom surface 804. A first bore 810 is formed into the body 800 from the top surface 802. The first bore 810 is positioned at least partially in an extending portion 806. The extending portion 806 has a first passage 812 (shown in phantom) formed therethrough. The end of the first passage 812 servers to connect the valve body 800 to the conduits leading to the remote plasma source 262. The second end of the first passage 812 is teed into a second passage 824 (also shown in phantom). The first bore 810 is aligned with the first passage 812 and is sized to receive the flapper as to control the flow of fluid through the first passage 812 to the second passage 824. A plurality of threaded blind mounting holes 816 are formed in the first side 802 of the valve body 800 to retain the seal cup (not shown) to the valve body 800.

The second side 804 of the valve body 800 includes a second and third bores 818. The second and third bores 818 communicate with the second passage 824 on either side of intersection of the first and second passages 812, 824. An o-ring groove 820 circumscribes each bore 818 to allow the conduits extending from the valve 800 into the chamber body to be sealingly coupled to the valve 800. The o-rings may be compressed to seal a fitting coupled to the second and third bores 818 using fasteners (not shown) passed through mounting holes 822 formed through the body 800. In the embodiment depicted in FIGS. 8A-8B, four mounting holes 822 are associated with each bore 818.

Figure 8C:
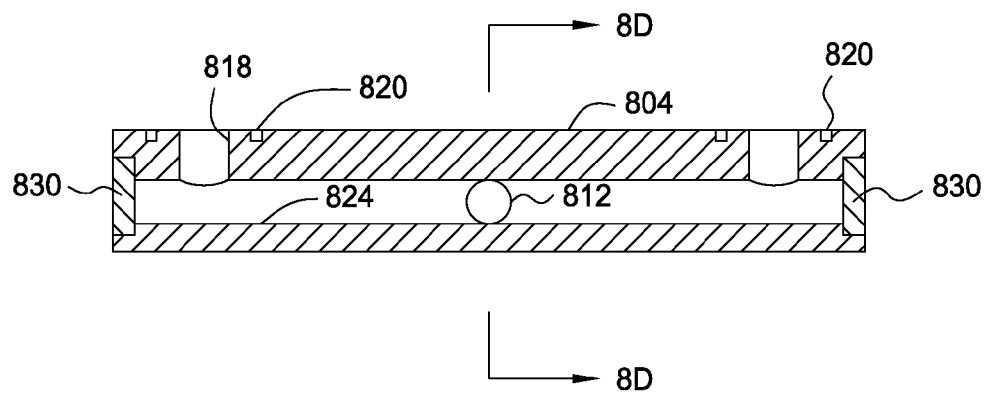
FIG. 8C is a cross-sectional view of the valve body taken along section line 8C-8C of FIG. 8B.

Referring now to the sectional view of FIG. 8C, the second passage 824 may be sealed at either end by plugs 830. The plugs 830 may be pressed fit, welded, bonded, adhered, threaded or sealingly coupled to the body 800 by another suitable manner.

Figure 8D:
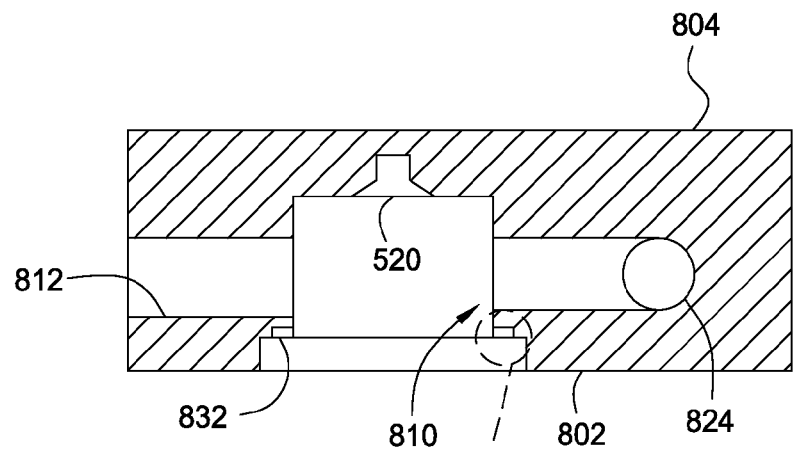
FIG. 8D is a cross-sectional view of the valve body taken along section line 8D-8D of FIG. 8C.
Figure 8D:
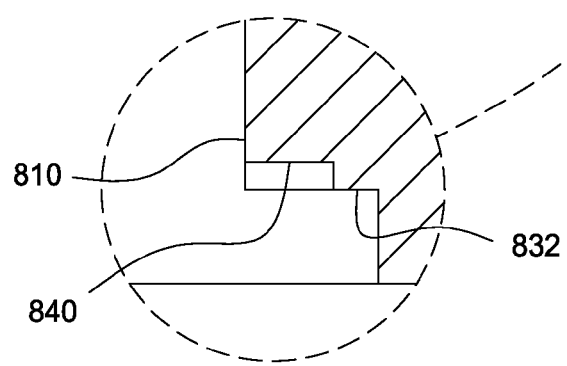

Referring now to the sectional view of FIG. 8D, the first bore 810 include a ledge 832 that interfaces with the outer body of the flapper and/or supports the lower race 397 of the bearing 398. The obstructing plate of the flapper extends into the bore 810 and may be rotated as to control the flow through the first passage 812. The bottom of the first bore 810 may also include a pocket 520 to facilitate retention of the ball (not shown) disposed between the flapper and the body 800. In embodiments wherein a bearing 398 is utilized, the ledge 832 may include a plurality of depressions 840 that are configured to mate with projections extending from the lower race 397 of the bearing 398 such that the lower race 397 is fixed to the body 800 while the flapper 500 rotates.

Returning to FIG. 1, a flange support 299 is coupled in line with the outlet of the remote plasma source 262 to allow a pressure sensor 297 to detect a metric indicative of the output pressure of the remote plasma source 262. The sensor 297 may be in the form of a manometer, pressure gage or other sensor suitable for obtaining a metric indicative of the pressure of the cleaning agent exiting the remote plasma source 262.

Figure 9:
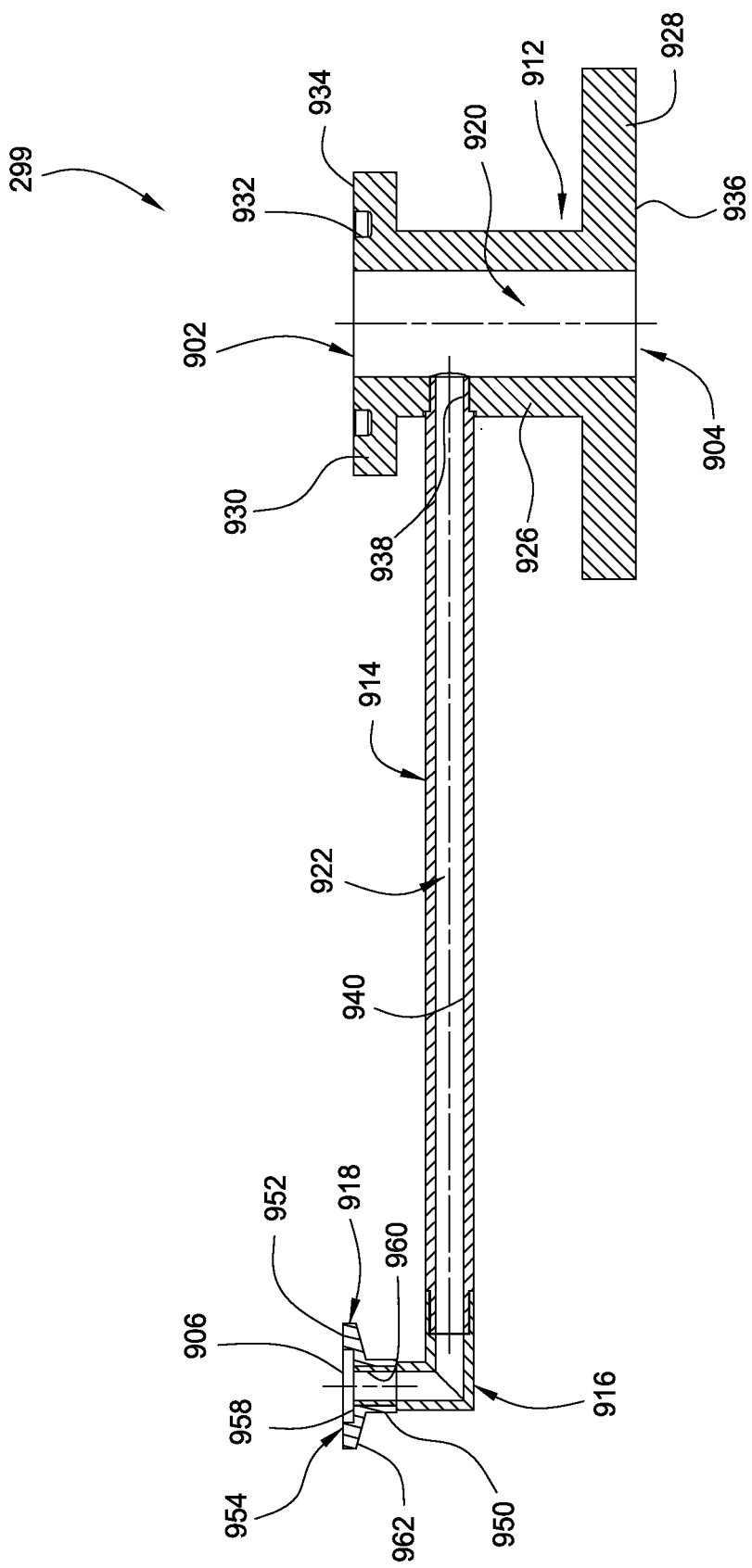
FIG. 9 depicts one embodiment of flange support.

FIG. 9 depicts one embodiment of flange support 299. The flange support 299 includes an inlet 902 and two outlets 904, 906. The inlet 902 is coupled to the outlet of the remote plasma source 262 and fluidly coupled to the first outlet 904 through a main passage 920 extending through the flange support 299. The first outlet 904 is coupled to the conduit that provides the cleaning agent from the remote plasma source 262 to the valve 300 and entry ports 260. The second outlet 906 is fluidly coupled to the main passage 920 coupling the inlet 902 to the first outlet 904 by a secondary passage 922. The second outlet 906 is configured to accept the sensor 297.

In one embodiment, the flange support 299 includes a flange base 912, a pipe 914, an elbow 916 and a flange 918 which are assembled as a pressure tight assembly. In one embodiment, the flange base 912, pipe 914, elbow 916 and flange 918 are fabricated from aluminum or stainless steel and are welded together, for example, by a continuous weld. The flange base 912 includes a cylindrical body 926 through which the main passage 920 is formed. The cylindrical body 926 has a major flange 928 at a first end and a minor flange 930 through a second end.

The inlet 902 is formed through the minor flange 930 and is circumscribed by an o-ring groove 932 on its face 934. The face 934 of the minor flange 930 also includes a plurality of mounting holes, not shown, which is one embodiment are in the form of a plurality of through holes.

The first outlet 904 is formed through the major flange 928. A face 936 of the major flange 928 is finished to provide a sealing surface. The face 936 of the major flange 928 also includes a plurality of mounting holes, not shown, which is one embodiment are in the form of a plurality of through holes.

The cylindrical body 926 includes a hole 938 which breaks into the main passage 920. In one embodiment the hole 938 is formed substantially perpendicular to the centerline of the body 926, which is coaxial with the centerline of the main passage 920.

The pipe 914 is configured to sealing couple to the cylindrical body 926 in a manner that fluidly coupled a passage 940 defined through the pipe 914 with the hole 938. In one embodiment, a first end of the pipe 914 has a taper or has a reduced outside diameter that is inserted into the hole 938 to facilitate coupling of the pipe 914 to the body 926. The second end of the pipe 914 may have a taper or has a reduced outside diameter that is inserted into the elbow 916 to facilitate coupling of the pipe 914 to the elbow 916.

The flange 918 includes a cylindrical stem 950 having a passage 960 formed therethrough. One end of the stem 950 has a lip 952. The lip 952 circumscribes a port 954 that defines the second outlet 906. The port 954 is configured in manner suitable for coupling the sensor 297 to the flange support 299.

In one embodiment, a face 956 of the lip 952 includes a recess 958 which is concentric with the passage 960 through the stem 950. The face 956 of the lip 952 may have an orientation substantially perpendicular to the centerline of the passage 960. A backside 962 of the lip 952 may be tapered to facilitate coupling a fitting, not show, utilized to secure the sensor 297. In one embodiment, the backside of the lip forms an angle with the stem of about 205 degrees. The passage 960 formed through the flange 918, a passage 964 formed through the elbow 916, the passage 940 formed through the pipe 914 and the hole 938 formed in the support flange 912 define the secondary passage 922.

Thus, the flange support 299 allows direct delivery of the cleaning agents from the remote plasma source 262 with minimal obstruction which would adversely promote recombination. Additionally, the flange support 299 facilitates coupling of the sensor 297 in a convenient location that is remote from the other utilities routed to the top of the chamber.

While the foregoing is directed to certain embodiments of the present invention, other and further embodiments of the invention may be devised without departing from the basic scope thereof, and the scope thereof is determined by the claims that follow.

What is claimed is:

1. A processing chamber comprising:
   a chamber body defining at least a first processing region and a second processing region, wherein the chamber body has:
   a substrate support in each processing region;
   a first entry port formed above the first processing region and coupled to a first gas distribution assembly disposed over a top portion of the first processing region;
   a second entry port formed above the second processing region and coupled to a second gas distribution assembly disposed over a top portion of the second processing region;
   a first vertical passage extending downward through a chamber wall;
   one or more first cross channels open to a bottom portion of the first processing region and intersecting the first vertical passage;
   a second vertical passage extending downward through the chamber wall; and
   one or more second cross channels open to a bottom portion of the second processing region and intersecting the second vertical passage;
   a remote plasma source configured to provide a cleaning plasma towards the top portions and/or the bottom portions of the first and second processing regions;
   a first gas conduit connecting the remote plasma source to the first and second entry ports; and
   a valve having an inlet coupled to the first gas conduit and at least one outlet coupled to the first and second vertical passages, wherein opening of the valve selectively diverts a portion of the cleaning plasma from the remote plasma source to the bottom portions of the first and second processing regions for introducing the cleaning plasma to a lower side of the substrate support.

2. The processing chamber of claim 1, further comprising a processing gas source coupled to the first gas conduit.

3. The processing chamber of claim 1, further comprising a second gas conduit connecting between the valve and the first and second vertical passages.

4. The processing chamber of claim 1, wherein the valve comprises:
   a valve body;
   a movable flapper housed by the valve body; and
   a coupling mechanism disposed outside the valve body operable to rotate the movable flapper.

5. The processing chamber of claim 4, wherein the flapper comprises
   a flow-obstructing plate; and
   an outer body attached to the flow-obstructing plate, wherein at least one magnet is encased in the outer body of the flapper.

6. The processing chamber of claim 5, wherein the valve further comprises a bearing interfacing between an end of the flow-obstructing plate and a wall of the valve body to facilitate rotation of the flapper.

7. The processing chamber of claim 6, wherein the valve further comprises a seal cup securely fixed to the valve body, and the outer body of the flapper is cylindrical and surrounded by the seal cup.

8. The process chamber of claim 7, wherein the valve further comprises an additional bearing interfacing between the outer body and the seal cup.

9. The processing chamber of claim 7, wherein the coupling mechanism comprises a U-shaped body having magnetized end portions, and the coupling mechanism is positioned outside the seal cup with the two magnetized end portions facing two opposite poles of the magnet encased in the outer body.

10. The processing chamber of claim 9, wherein the valve further comprises an actuator mounted to the valve, the actuator is one of a solenoid, air motor, electric motor and pneumatic cylinder, and the actuator rotates the coupling mechanism in a controlled manner.

11. The processing chamber of claim 4, wherein the coupling mechanism is configured to rotate the flapper through magnetic interaction.

12. The processing chamber of claim 1, further comprising a source of at least one of $NF_3$, $F_2$, $SF_6$, $Cl_2$, $CF_4$, $C_2F_6$, $CCl_4$ or $C_2Cl_6$ coupled to the remote plasma source.

13. The processing chamber of claim 1, wherein the first and second cross channels are oriented to produce a substantially inward flow of gases into the corresponding processing regions.

14. A substrate processing system comprising:
   a loadlock chamber;
   a transfer chamber coupled to the loadlock chamber; and
   a processing chamber coupled to the transfer chamber, wherein the processing chamber comprises:
   a substrate support in each processing region;
   a first entry port formed above the first processing region and coupled to a first gas distribution assembly disposed over a top portion of the first processing region;
   a second entry port formed above the second processing region and coupled to a second gas distribution assembly disposed over a top portion of the second processing region;
   a first vertical passage extending downward through a chamber wall;
   one or more first cross channels open to a bottom portion of the first processing region and intersecting the first vertical passage;
   a second vertical passage extending downward through the chamber wall; and
   one or more second cross channels open to a bottom portion of the second processing region and intersecting the second vertical passage;
   a remote plasma source configured to provide a cleaning plasma towards the top portions and/or the bottom portions of the first and second processing regions;
   a first gas conduit connecting the remote plasma source to the first and second entry ports; and
   a valve having an inlet coupled to the first gas conduit and at least one outlet coupled to the first and second vertical passages, wherein opening of the valve selectively diverts a portion of the cleaning plasma from the remote plasma source to the bottom portions of the first and second processing regions for introducing the cleaning plasma to a lower side of the substrate support.

15. The substrate processing system of claim 14, wherein the processing chamber further comprises a processing gas source coupled to the first gas conduit.

16. The substrate processing system of claim 14, wherein the processing chamber further comprises a second gas conduit connecting between the valve and the first and second vertical passages.

17. The substrate processing system of claim 14, wherein the valve comprises:
a valve body;
a movable flapper housed by the valve body; and
a coupling mechanism disposed outside the valve body operable to rotate the movable flapper.

18. The substrate processing system of claim 17, wherein the flapper comprises
a flow-obstructing plate; and
an outer body attached to the flow-obstructing plate, wherein at least one magnet is encased in the outer body of the flapper.

19. The substrate processing system of claim 18, wherein the coupling mechanism is configured to rotate the flapper through magnetic interaction.

20. The substrate processing system of claim 14, further comprising a source of at least one of $NF_3$, $F_2$, $SF_6$, $Cl_2$, $CF_4$, $C_2F_6$, $CCl_4$ or $C_2Cl_6$ coupled to the remote plasma source.

* * * * *